United States Patent
Nesemann et al.

(10) Patent No.: US 10,615,606 B2
(45) Date of Patent: Apr. 7, 2020

(54) CIRCUIT FOR VOLTAGE LIMITATION IN A PHOTOVOLTAIC FIELD, PHOTOVOLTAIC FIELD, AND METHOD FOR VOLTAGE LIMITATION

(71) Applicant: SMA Solar Technology AG, Niestetal (DE)

(72) Inventors: Karl Nesemann, Kaufungen (DE); Andreas Falk, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 38 days.

(21) Appl. No.: 16/108,852

(22) Filed: Aug. 22, 2018

(65) Prior Publication Data

US 2019/0013420 A1    Jan. 10, 2019

Related U.S. Application Data

(63) Continuation of application No. PCT/EP2017/083146, filed on Dec. 15, 2017.

(30) Foreign Application Priority Data

Dec. 21, 2016 (DE) .................. 10 2016 125 219

(51) Int. Cl.
*H02J 3/38* (2006.01)
*H02S 50/00* (2014.01)
(Continued)

(52) U.S. Cl.
CPC ........ *H02J 3/383* (2013.01); *H01L 31/02021* (2013.01); *H02S 40/36* (2014.12); *H02S 50/00* (2013.01)

(58) Field of Classification Search
CPC ... H01L 31/02021; H02S 40/36; H02S 50/00; H02J 3/383
See application file for complete search history.

(56) References Cited

U.S. PATENT DOCUMENTS 9,356,553 B2 * 5/2016 Augustoni ............. H02S 50/00
2011/0203635 A1   8/2011 Beck
(Continued)

FOREIGN PATENT DOCUMENTS

DE   102009044695 A1   6/2011
EP       2362520 A1   8/2011
(Continued)

OTHER PUBLICATIONS

International Search Report dated Apr. 16, 2018 in connection with International Application PCT/EP2017/083146.

*Primary Examiner* — Carlos Amaya
(74) *Attorney, Agent, or Firm* — Eschweiler & Potashnik, LLC

(57) ABSTRACT

A circuit for limiting the voltage of a photovoltaic string divided into a first section and a second section of a series circuit of solar modules, includes a first terminal for connection to a first end of the first section, a second terminal for connection to a first end of the second section and a third terminal for connection to a second end of the second section. The circuit also includes a bypass switch, which is connected at one end to the first terminal and at the other end to the third terminal and a disconnect switch, which is connected at one end to the first terminal and at the other end to the second terminal. The circuit has a controller for actuating the bypass switch and the disconnect switch, wherein the controller is configured to determine a first threshold value $U_{UL}$ and a second, lower threshold value $U_{LL}$ depending on a switch voltage $U_{OC}$ dropped across the disconnect switch in an open state and taking into account the number of solar modules in the first section and in the second section.

19 Claims, 5 Drawing Sheets

(51) Int. Cl.
*H01L 31/02* (2006.01)
*H02S 40/36* (2014.01)

(56) References Cited

U.S. PATENT DOCUMENTS

2013/0049710 A1   2/2013   Kraft
2013/0076144 A1   3/2013   Agamy
2015/0349709 A1   12/2015  Ponec
2016/0344212 A1   11/2016  Murano

FOREIGN PATENT DOCUMENTS

JP    S6017516 A    1/1985
WO    2015092441 A2 6/2015

* cited by examiner

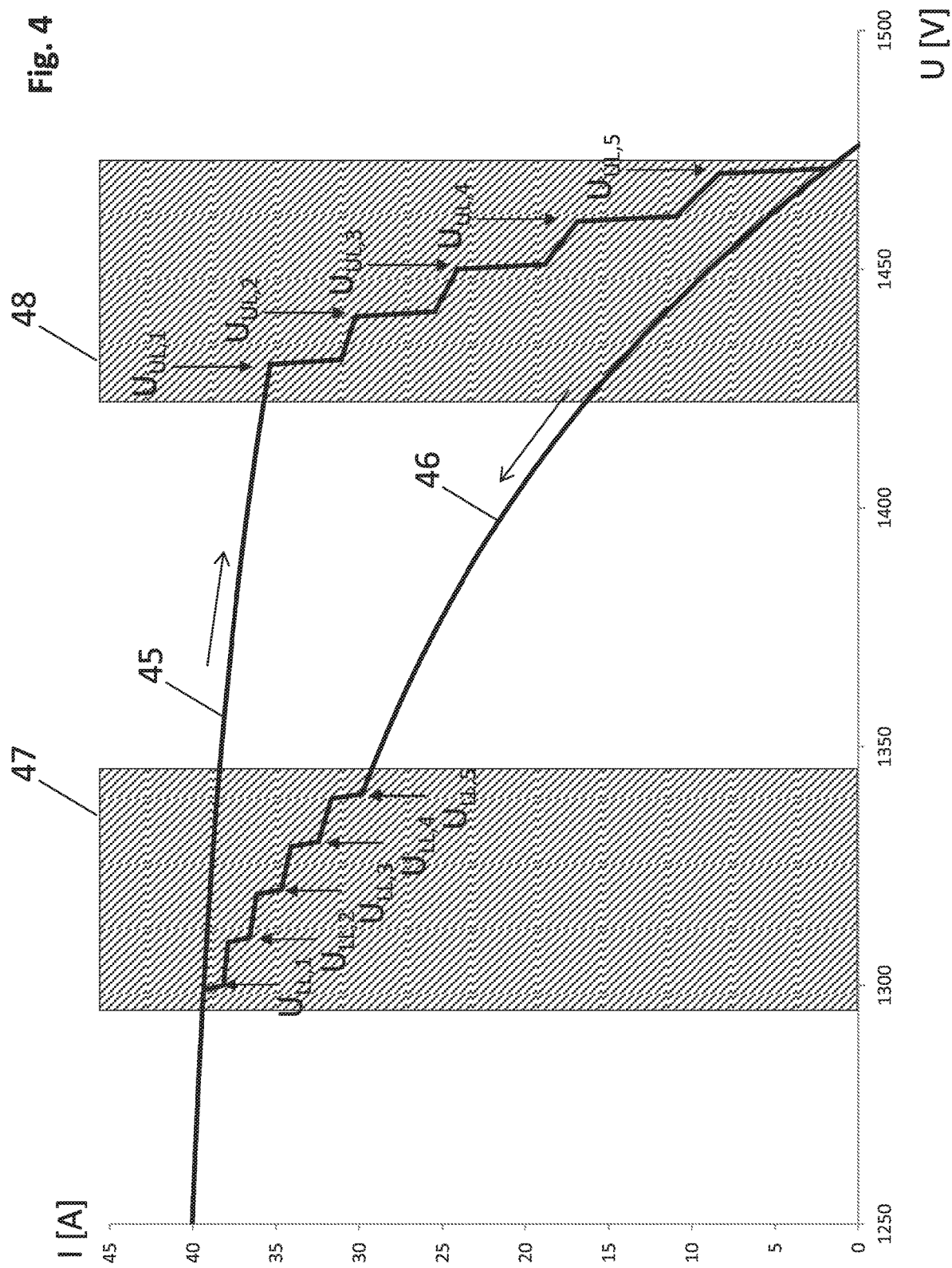

CIRCUIT FOR VOLTAGE LIMITATION IN A PHOTOVOLTAIC FIELD, PHOTOVOLTAIC FIELD, AND METHOD FOR VOLTAGE LIMITATION

CROSS REFERENCE TO RELATED APPLICATIONS

This application is a continuation of International Patent Application number PCT/EP2017/083146, filed on Dec. 15, 2017, which claims priority to German Patent Application number 10 2016 125 219.0, filed on Dec. 21, 2016, and is hereby incorporated by reference in its entirety.

FIELD

The disclosure relates to a circuit for limiting the voltage of a photovoltaic string, to a photovoltaic field having a plurality of parallel strings, which have a circuit of this kind, and to a method for limiting the voltage of a photovoltaic string.

BACKGROUND

In order to be able to design large photovoltaic energy generation installations in an efficient manner, it is desirable to connect as many solar modules as possible in series so that the series circuit, what is known as a string, has a very high voltage. In order not to exceed the permissible input voltage range of a connected inverter or the permissible module voltage with respect to ground potential, the length of such a string has to be limited so that the open-circuit voltage thereof does not exceed the maximum permissible value, even in the case of extreme conditions, in particular at low temperatures and high insolation.

Alternatively, it is known from the prior art to provide circuits that disconnect or short-circuit some of the modules when a maximum string voltage is exceeded in order to achieve a reduction in the voltage. After the string voltage has dropped again to a sufficient extent, the short-circuit or the disconnection can be discontinued again. One example of such a circuit is disclosed in document US 2013/0049710 A1, in which, for the purpose of voltage limitation, two or more solar modules of a string are bypassed by means of a relay when an open-circuit state of the string is identified.

Document DE 10 2010 009 120 A1, for example, further discloses a photovoltaic field of parallel strings, wherein some of the parallel strings can be short-circuited jointly by means of a short-circuiting switch, which is activated when a prescribed voltage is exceeded by the string. Since the short-circuiting of a portion of a string constitutes a loss of performance for the energy generation installations, it is desirable to be able to shorten the strings individually in order to have to shorten only the number of strings required in the present situation. In this case, however, it must be ensured that the shortened strings are not brought into a reverse current situation due to the long strings, in which reverse current situation, in the short strings, a current magnitude that significantly exceeds the rated current of the string flows in the reverse direction and can damage the strings.

SUMMARY

The present disclosure is directed to a circuit and a method, respectively, for limiting the voltage of a string, which circuit and method are capable of shortening the string when a threshold value is exceeded by the string voltage, wherein the threshold value is determined by the circuit so that damaging reverse current situations are prevented. The disclosure is further directed to a photovoltaic field having a plurality of parallel strings each having such a circuit, wherein the circuits of the individual strings operate independently of one another.

A circuit according to the disclosure for limiting the voltage of a photovoltaic string, which is divided into a first section and a second section of a series circuit of solar modules, comprises a first terminal for connection to a first end of the first section, a second terminal for connection to a first end of the second section and a third terminal for connection to a second end of the second section. The circuit also comprises a bypass switch, which is connected at one end to the first terminal and at the other end to the third terminal, and a disconnect switch, which is connected at one end to the first terminal and at the other end to the second terminal. A controller of the circuit serves to actuate the bypass switch and the disconnect switch, wherein the controller is configured to determine a first threshold value $U_{UL}$ and a second, lower threshold value $U_{LL}$ depending on a switch voltage $U_{OC}$ dropped across the disconnect switch in an open state and taking into account the number of solar modules in the first section and in the second section The controller is also configured to compare a module voltage $U_S$ dropped between the first terminal and a voltage input of the circuit with the threshold values $U_{UL}$, $U_{LL}$, in order to open the disconnect switch and to close the bypass switch when the first threshold value $U_{UL}$ is exceeded by the module voltage $U_S$, and to open the bypass switch and to close the disconnect switch when the second threshold value $U_{LL}$ is undershot by the voltage $U_S$.

The circuit according to the disclosure can electrically connect the sections to one another or isolate them from one another depending on the module voltage $U_S$ so that, in the case of a sufficiently low module voltage and thus a string voltage that can be determined therefrom, the first section and the second section can be connected in series—referred to in the following text as the long state of the string—whereas, in the case of such a high module voltage that a series circuit of the sections would lead to an undesirably high string voltage, the second section is disconnected and bypassed and thus does not contribute to the string voltage—referred to in the following text as the short state of the string. In this way, the circuit ensures limitation of the string voltage without reducing the maximum power that can be achieved by the string. In this case, the circuit can also be integrated into existing strings retrospectively, since the string has to be divided only into a first and a second section for this and the terminals of the circuit have to be connected to corresponding terminal points of the string.

The circuit is advantageously configured to supply energy from the module voltage $U_S$ and is thus not assigned to its own energy source. To this end, the circuit draws the energy required for operation from the voltage applied between the first terminal and the voltage input. If necessary, an energy store, for example a capacitor, supercapacitor or a chargeable battery, is provided in order to supply power to the circuit even at times at which the applied module voltage $U_S$ is insufficient.

The disconnect switch and the bypass switch are, in one embodiment, provided as semiconductor switches, in particular as field-effect transistors or bipolar transistors, more specifically as IGBTs or MOSFETs, and can be of the same type or of different types. An intrinsic or a separate antiparallel freewheeling diode can be provided with the switches.

On account of the provided connection of the terminals of the circuit, the voltage dropped across the opened disconnect switch corresponds to the open-circuit voltage of the second section if the bypass switch is closed or, on account of a freewheeling diode associated with the bypass switch, no noteworthy voltage is dropped across the bypass switch. The measurement of the voltage dropped across the opened disconnect switch therefore permits determination of the open-circuit voltage of the solar modules and of the string. From this knowledge, it is possible to derive directly, whether and, if applicable, to what extent the string voltage exceeds an open-circuit voltage of the first section so that a reverse current can arise when the second section is isolated from or bypassed by the first section. The second threshold value $U_{LL}$ can be selected accordingly so that reverse currents are prevented or at least limited to a safe extent.

At this point, it should be advised that, for the determination of suitable threshold values $U_{UL}$, $U_{LL}$, the knowledge of the number of solar modules in the first section and the number of solar modules in the second section as well as the number of solar modules by means of which the module voltage $U_S$ is determined have to be stored in the controller. The values can be stored as absolute or as relative values. With knowledge of these values, it is possible to convert the module voltage $U_S$ directly to a voltage dropped across the first section or to a string voltage.

When the disconnect switch is closed and the open-circuit voltage of the second section cannot be determined as a voltage dropped across the disconnect switch, it is advantageous to provide a condition in the controller, the meeting of which condition is checked continuously or regularly. The condition describes a necessity of checking the open-circuit voltage of the second section to determine whether the open-circuit voltage has changed and of updating the threshold values $U_{UL}$, $U_{LL}$. When the condition is met when the disconnect switch is closed, the controller updates the threshold values $U_{UL}$, $U_{LL}$ by virtue of the disconnect switch being briefly opened and the switch voltage $U_{OC}$ dropped across the opened disconnect switch being determined. The updated threshold values are determined from the determined switch voltage. The condition can comprise an expiry of a prescribed period since the last closure of the disconnect switch. As an alternative or in addition, the condition can also comprise an exceeding of a prescribed change threshold value by the difference of the module voltage $U_S$ between the present value and the value determined directly after the last closure of the disconnect switch. A condition that depends on a change in temperature of the solar modules since the last closure of the disconnect switch is also conceivable.

In a further aspect, a photovoltaic field comprises a plurality of strings connected in parallel between a first and a second DC voltage bus, which strings each have a first section and a second section of series circuits of solar modules. The first and the second section are connected to one another by means of a circuit according to the disclosure described above, wherein in each case one end of the first section is connected to the first DC voltage bus and the other end of the first section is connected to the first terminal of the circuit. At the same time, one end of the second section is connected to the second terminal of the circuit and the other end of the second section is connected to the second DC voltage bus. The third terminal of the circuit is likewise connected to the other end of the second section, while the voltage input is connected to a terminal of a solar module of the first section opposite to the first terminal of the circuit, so that the voltage of a portion of the first section or of the entire first section is dropped between the first terminal of the circuit and the voltage input and can be determined as the module voltage $U_S$. In order to keep the module voltage low, the voltage input can, in one embodiment, be connected to the terminal of that solar module of the first section that is connected directly to the first terminal of the circuit using the other terminal. In this way, the module voltage $U_S$ corresponds to the voltage of a single solar module.

In order to adjust the photovoltaic field to the input voltage range of a connected inverter in optimum fashion, the number of solar modules of the first section can be selected in such a way that, in the case of a lowest specified ambient temperature and a highest specified insolation, the open-circuit voltage of the solar modules still remains below a prescribed maximum value, and the number of solar modules of the second section can be selected in such a way that, under the same specified extreme conditions, an MPP voltage of the series circuit of the first and second section still remains below the specified maximum value. In this case, the maximum value corresponds to the maximum input voltage of the inverter or to the specified maximum voltage of a component of the photovoltaic field, for example to the maximum insulation voltage of the solar modules. This can result in a situation in which the inverter can remain connected to the photovoltaic field even in the case of the specified extreme conditions in the open-circuit state. The maximum value is preferably greater than 1000 volts, in particular 1500 volts, and thus corresponds to common specifications of commercially available inverters for rural installations.

The other end of the second section can be connected directly to the second DC voltage bus. However, a third section of solar modules can also be arranged between the other end and the DC voltage bus so that the second section that can be bypassed is arranged between two sections that cannot be bypassed. Such a third section of solar modules is taken into account during the determination of the number of solar modules of the first section so that subsequently reference can no longer be made explicitly to the number of solar modules in the third section because this number is concomitantly counted in the first section.

In a photovoltaic field comprising a plurality of parallel strings of which the voltage is limited by the circuit according to the disclosure, it may be advantageous to ensure that the strings do not change between the long and the short state simultaneously, if possible. This contributes to voltage-stable operation of the photovoltaic field. This can be achieved by storing in each case an offset that is different from the other string in the circuits of the parallel strings, which offset causes the controllers of the circuits to determine different threshold values $U_{UL}$, $U_{LL}$ in the case of an identical determined switch voltage $U_{OC}$. Threshold values that are different from one another in the various circuits of the strings are thus generally also determined when the temperature conditions and insolation conditions between the strings are identical. Different points in time of the change between the long and short state of the string are achieved accordingly.

A method according to the disclosure for limiting the voltage of a photovoltaic string, which has comprising a first section and a second section of solar modules, wherein a bypass switch is arranged in parallel with the second section and a disconnect switch is arranged in series with the solar modules of the second section, comprises repeatedly determining a module voltage $U_S$ within the first section and a switch voltage $U_{OC}$ dropped across the disconnect switch while the disconnect switch is open and the bypass switch is closed. A first threshold value $U_{UL}$ and a second, lower threshold value $U_{LL}$ are determined depending on the switch voltage $U_{OC}$ and taking into account a number of solar modules in the first section and in the second section. The bypass switch is closed and the disconnect switch is opened to produce a short state of the string when the currently determined module voltage $U_S$ exceeds the first threshold value $U_{UL}$. The bypass switch is opened and the disconnect switch is closed to produce a long state of the string when the currently determined module voltage $U_S$ undershoots the second threshold value $U_{LL}$. In this way, the string can autonomously change in good time to the short state in order to prevent an excessive string voltage and change back to the long state when the string voltage has dropped to a sufficient extent. In particular, the method works without communication, for example to a superordinate control device.

In this case, the threshold values are not fixedly prescribed but are adjusted flexibly to the prevailing operating conditions, for example to the prevailing temperature and insolation. In this case, the adjustment does not even require appropriate sensors since the determined voltages already contain sufficient information about the prevailing conditions. Nevertheless, the inclusion of further sensor data, for example from a temperature or an insolation sensor or from a current sensor for determining the string current, should not be excluded since this inclusion can further improve the method. The fact that voltage values determined on other strings, in particular voltage values obtained in the case of a parallel execution of the method according to the disclosure, are taken into account in the determination of the threshold values should also not be excluded, even though this restricts the advantage of the autonomy of the change of state.

During the change from the long state to the short state, the disconnect switch is, in one embodiment, first opened before the bypass switch is closed. In an analogous manner, during the change from the short state to the long state, the bypass switch is first opened and then the disconnect switch is closed. It should furthermore be ensured that the disconnect switch was opened for a sufficient time before the voltage dropped across it is determined in order that the voltage determined in this way also constitutes the open-circuit voltage of the second section. In one embodiment of the disclosure, a waiting time of 1µs is provided between the switching of the disconnect switch and the switching of the bypass switch. In a further embodiment, after the disconnect switch has been opened, a waiting time of between 200 µs and 10 ms can be provided before the voltage dropped across the disconnect switch is determined.

When the string remains in the long state for a long time, it may be expedient to recalibrate the threshold values in order to meet the time of the change to the short state in optimum fashion. To this end, a condition for recalibration is checked while the string is in the long state. When the condition is met, the switch position briefly changes to the short state in order to determine the switch voltage $U_{OC}$ dropped across the disconnect switch and to determine updated threshold values $U_{UL}$, $U_{LL}$ therefrom. An updated module voltage $U_S$ is, in one embodiment, determined at the same time and compared with the updated threshold value $U_{UL}$. If the updated module voltage $U_S$ is below the updated threshold value $U_{UL}$, there is a change back to the long state; otherwise, the string remains in the short state.

The condition for recalibration can comprise the expiry of a waiting time in which the string was in a long state. In one embodiment, a waiting time between 100 seconds and 30 minutes is used. The waiting time should be selected so that the prevailing operating conditions during this time do not change significantly.

In one variant of the method, the condition for the recalibration comprises an exceeding of a prescribed change threshold value by the difference of the module voltage $U_S$ between the actual value and the value directly after the last change to the long state. Through the exceeding of the change threshold value, it is thus possible to detect a significant change in the prevailing operating conditions. Of course, it is conceivable to link a plurality of partial conditions, for example the two condition examples described above, through logic combination with the condition for the recalibration.

In one embodiment of the method according to the disclosure, the first threshold value $U_{UL}$ is determined first, for example by virtue of a functional correlation between the module voltage $U_S$ and/or the voltage $U_{OC}$ dropped across the disconnect switch as functional parameters and the first threshold value $U_{UL}=f(U_S, U_{OC})$ being taken as a basis. It is likewise conceivable to determine the first threshold value $U_{UL}$ by means of a value table, where appropriate with interpolation between the values of the value table. The second threshold value can be determined in principle by means of a second functional correlation or a second value table in an analogous manner. However, it is particularly advantageous to determine the second threshold value $U_{LL}$ only from the first threshold value $U_{UL}$ that has already been determined. This determination can also take a third functional correlation $U_{LL}=g(U_{UL})$ or a third value table as a basis.

In order to prevent undesirably large or small threshold values, in each case permissible value ranges for the first threshold value $U_{UL}$ and the second threshold value $U_{LL}$ can be prescribed, wherein, in the case of departure from the respective permissible value range, the threshold value is set to the respective limit value of the value range.

BRIEF DESCRIPTION OF THE DRAWINGS

In the following text, the disclosure is illustrated using figures, in which

FIG. 4 shows a current-voltage characteristic curve profile of a photovoltaic field according to the disclosure.

DETAILED DESCRIPTION

Figure 1:
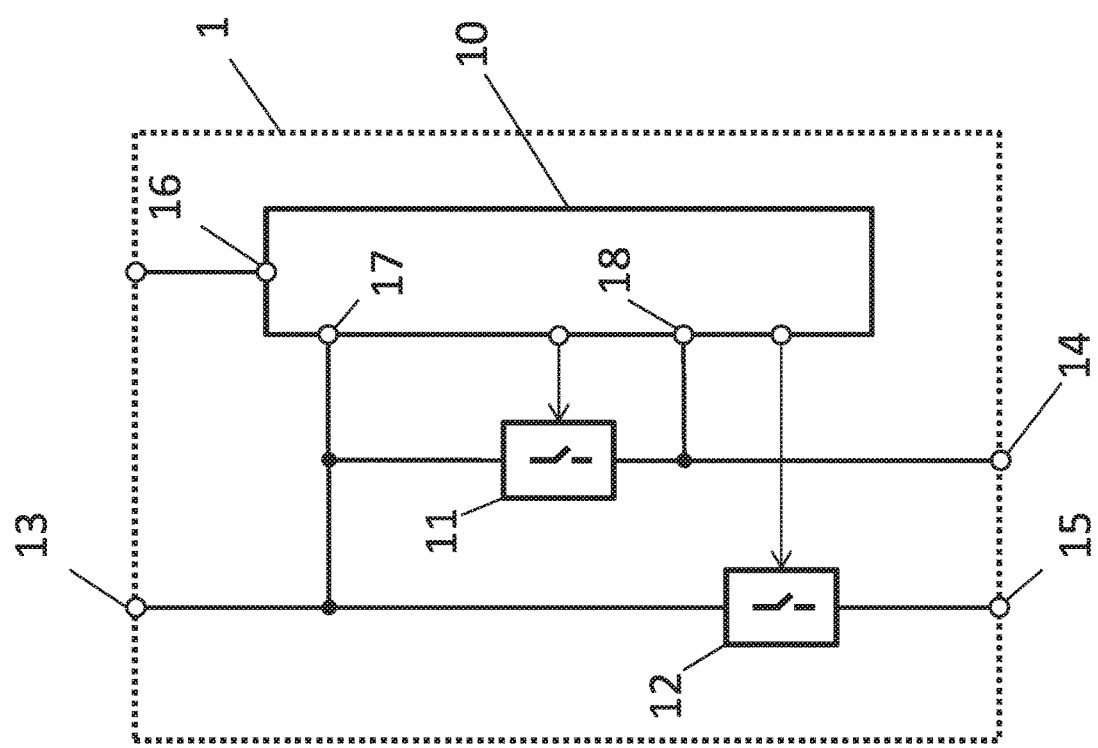
FIG. 1 shows a circuit according to the disclosure for limiting the voltage of a string.

FIG. 1 shows the design of a circuit 1 for connection to sections of a photovoltaic string. A first terminal 13 of the circuit 1, to which first terminal one end of a first section of a photovoltaic string can be connected, is connected to a second terminal 14 of the circuit 1 by means of a disconnect switch 11, to which second terminal one end of a second section of the string can be connected. In this way, an electrical connection between the first section and the second section can be controlled by means of the disconnect switch 11.

At the same time, the first terminal 13 is connected to a third terminal 15 of the circuit 1 by means of a bypass switch 12, which third terminal can be connected to the other end of the second section of the string. In this way, the second section can be bypassed in a controlled manner by means of the bypass switch 12 so that a current flowing through the first section can be conducted around the second section. In this way, it is possible to achieve a situation in which the string can be actuated in such a way that, in one switch position of the disconnect switch 11 and of the bypass switch 12, the string has a length that corresponds to the length of the first section and, in a further switch position, has a length that corresponds to the sum of the lengths of the first and the second section.

A controller 10 can open and close the disconnect switch 11 and the bypass switch 12 for changing the string length by means of corresponding control lines. To generate the switch-on and switch-off signals, the controller 10 has a first voltage input 17 and a second voltage input 18, by means of which a switch voltage $U_{OC}$ dropped across the disconnect switch 11 can be determined. In the case shown, the first voltage input 17 is connected to the first terminal 13 and the second voltage terminal 18 is connected to the second terminal 14. As a conceivable alternative, the second voltage input 18 can also be connected to the third terminal 15 and can thus determine the voltage dropped jointly across the disconnect switch 11 and the bypass switch 12.

When the string sections are connected as described above, the open-circuit voltage of the second section is dropped across the disconnect switch 11 when it is open. Furthermore, the controller 10 is connected to a third voltage input 16, which is connected to a connecting point between solar modules of the first section so that a module voltage $U_S$ of the first section of the string is dropped between the third voltage input 16 and the first voltage input 17 and can be determined. The third voltage input 16 is, in one embodiment, connected to the end opposite to the first terminal 13, of the solar module of the first section of the string, which solar module is connected directly to the circuit 1, so that the module voltage $U_S$ constitutes the present voltage of the solar module. As an alternative, it is also conceivable, of course, to connect the third voltage input 16 to another point of the series circuit of the solar modules of the first section 21 in order to thus determine the voltage across a plurality of solar modules or even across the entire first section 21 in this way.

Figure 2:
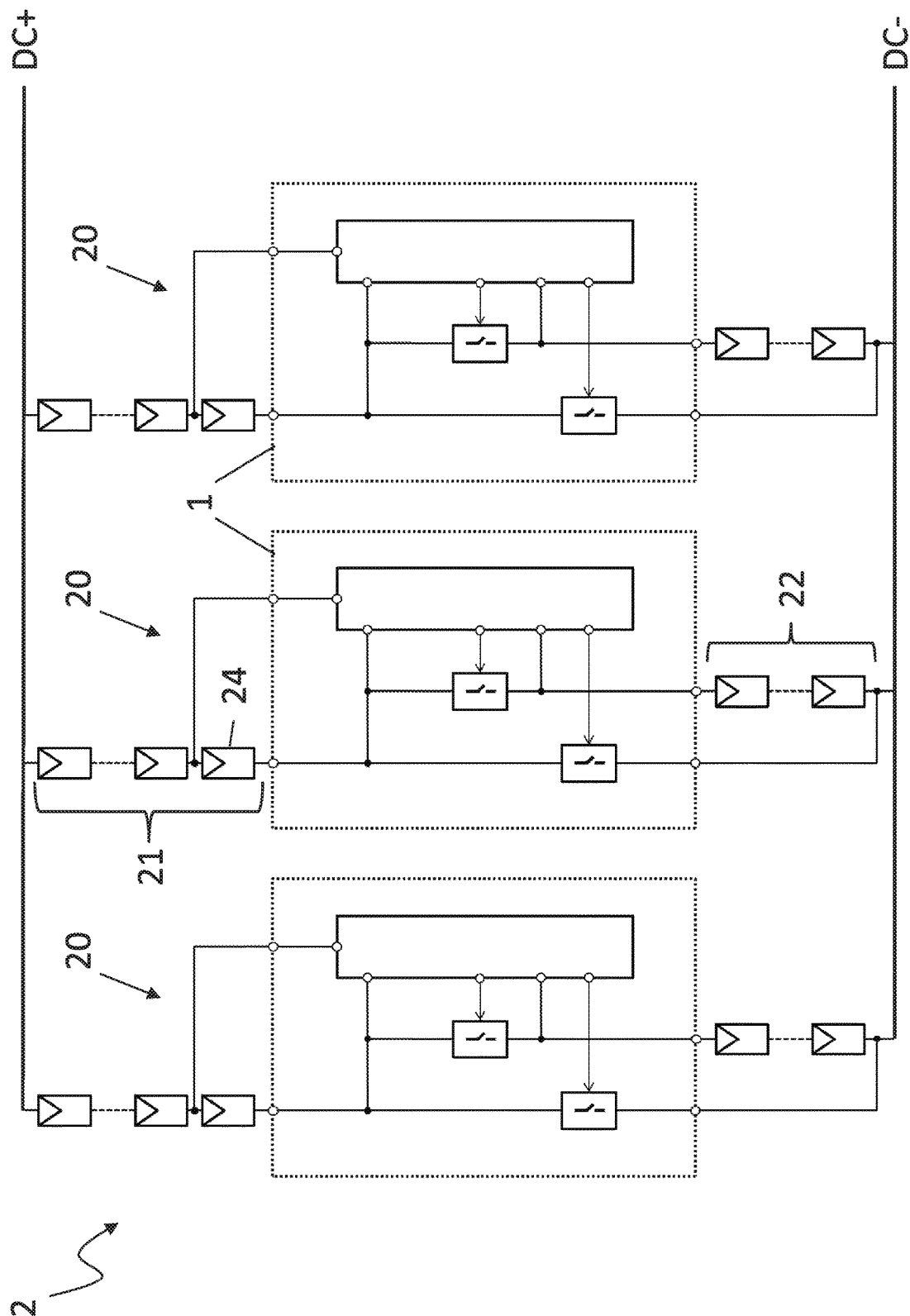
FIG. 2 shows a photovoltaic field according to the disclosure comprising parallel strings comprising a voltage-limiting circuit.

FIG. 2 shows a photovoltaic field 2 comprising a plurality of strings 20 connected in parallel, which strings each have a circuit 1 according to the disclosure. A first section 21 of a series circuit of solar modules of the string 20 is connected with a first end to the first terminal 13 of the circuit 1 and with another end to a positive DC bus DC+. The third voltage input 16 of the circuit 1 is connected to an end of a solar module 24, which end is remote from the first terminal 13, in order that the circuit 1 can determine the module voltage at the solar module 24. One end of a second section 22 of a series circuit of solar modules of the string 20 is connected at the second terminal 14 of the circuit 1, while the other end is connected to a negative DC bus DC−. The third terminal 15 of the circuit 1 is also connected to the negative DC bus DC−.

Figure 2A:
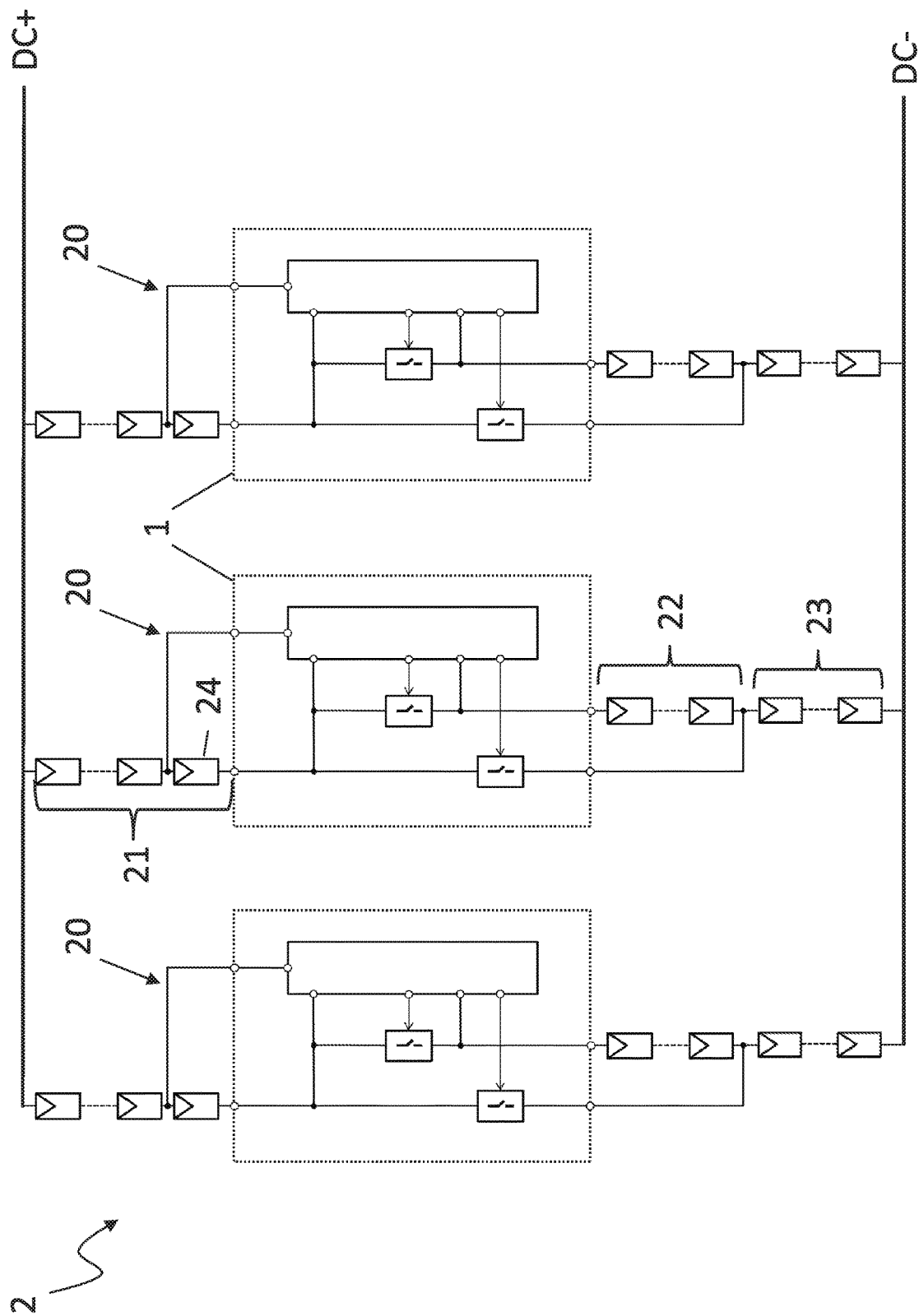
FIG. 2a shows a further photovoltaic field according to the disclosure comprising parallel strings comprising a voltage-limiting circuit.

The photovoltaic field 2 of FIG. 2a differs from that of FIG. 2 in that a third section 23 of solar modules is provided, which third section cannot be bypassed and which is arranged between the second section 22 and the negative DC bus DC−. In this arrangement, too, the circuit 1 can be used for voltage limitation.

Figure 3:
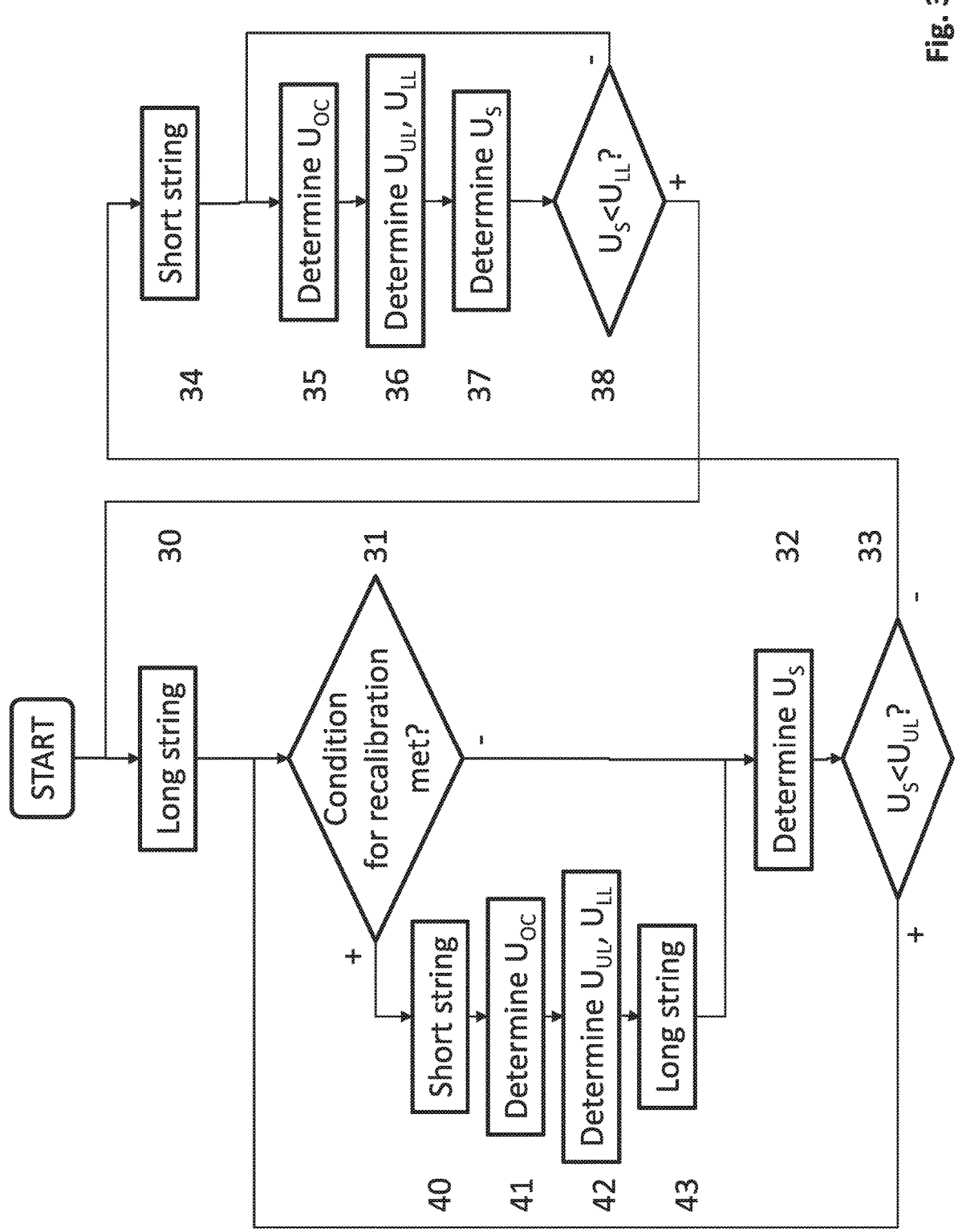
FIG. 3 shows a flowchart of a method according to the disclosure for limiting the voltage of strings.

A flowchart of a method according to the disclosure for reducing the voltage of a photovoltaic string is shown in FIG. 3. At the beginning of the method, the string is in a long state in accordance with act 30, that is to say that the first section and the second section are connected in series with one another. If necessary, the string is transferred to a long state through opening of the bypass switch 12 and closure of the disconnect switch 11. In this state, at 31, a check is carried out to determine whether a condition for recalibration of the threshold values is met. Reference is made once again to this condition and the acts undertaken when the condition is met in a later paragraph of the description. Subsequently, at 32, the module voltage $U_S$ is determined, wherein, where necessary, high-frequency components are removed by forming the mean value of a plurality of measurements or by low-pass filtering from the measurement result. Even when the module voltage $U_S$ is determined only at a portion of the first section or even only at a single solar module of the first section, it is assumed, for the sake of simplicity of the illustration, that the module voltage $U_S$ subsequently relates to the total voltage of the first section. If necessary, the determined value is provided with a suitable scaling factor, which takes into account the number of solar modules in the first and second section. The determined value of the module voltage $U_S$ is compared at 33 with the present first threshold value $U_{UL}$. If the module voltage $U_S$ is lower than the first threshold value $U_{UL}$ (+), there is a return to act 31.

However, if the module voltage $U_S$ exceeds the first threshold value $U_{UL}$ (−), a short state of the string is established at 34 by virtue of the bypass switch being closed and the disconnect switch being opened. Subsequently, at 35, the switch voltage $U_{OC}$ dropped across the disconnect switch is determined, which voltage is a measure of the open-circuit voltage of the solar modules and substantially corresponds to the open-circuit voltage of the second section. At 36, a current first threshold value $U_{UL}$ and a second, lower threshold value $U_{LL}$ are then determined from the switch voltage $U_{OC}$ determined in this way. During this determination, the number of solar modules of the first section and of the second section is concomitantly taken into account.

In one embodiment, the following formulae are used for ascertaining the threshold values:

$$U_{UL} = f_1(U_{OC}) * \frac{n+m}{m}; U_{LL} = f_2(U_{OC}) * \frac{n}{m}$$

In this case, n is the number of solar modules in the first section and m is the number of solar modules in the second section. The functions $f_1$ and $f_2$ can be defined, for example, by means of a look-up table. However, it is also conceivable to provide one or both functions $f_1$, $f_2$ as linear functions of the open-circuit voltage $U_{OC}$. The function $f_1$ is intended to be dimensioned independently thereof in such a way that the threshold value $U_{UL}$ is as high as possible but still not so low that the first section of the string is not exposed to a dangerously high reverse current due to the applied voltage in the case of transferral to the short state. The threshold value $U_{UL}$ is advantageously selected so that no reverse current occurs or so that it is ensured that the reverse current remains lower than the rated current of the solar module. It is furthermore recommended to provide upper and/or lower limit values for the threshold values $U_{UL}$, $U_{LL}$, which limit values define a value range that the threshold values are not intended to leave.

If it is desired for the circuits for voltage limitation in parallel strings not to switch between the strings at the same time even under identical temperature conditions and insolation conditions, it is advantageous to provide an offset value, which is determined differently between the parallel strings, for example as a random number. The offset value can be added to the threshold values determined according to the above formula.

Returning to the further description of the method according to the disclosure, at 37, after the updated threshold values $U_{UL}$, $U_{LL}$ have been determined, the module voltage $U_S$ is determined again, wherein the determined module voltage now relates only to the voltage of the first section of the string. The module voltage $U_S$ determined in this way is compared with the second threshold value $U_{LL}$. If the module voltage $U_S$ exceeds the second threshold value $U_{LL}$ (−), there is a return to act 35 and the string remains in the short state. Otherwise (+), the method branches off to act 30 and the string is transferred back to a long state.

Since the open-circuit voltage cannot be determined as the switch voltage $U_{OC}$ dropped across the disconnect switch in a long state of the string, there is a check at 31 described above as to whether a condition for recalibration of the threshold values is met. The condition can comprise the expiration of a clock since the last determination of updated threshold values. However, the condition can also comprise a change criterion for the module voltage. For example, it is possible to check whether the present module voltage has changed compared to the determined module voltage during the last change to the long state by a prescribed percentage or a prescribed absolute value. Of course, a logic combination of a plurality of conditions, in particular an OR combination, is also conceivable.

If the condition at 31 is met (+) the string is transferred to the short state at 40 so that, at 41, the switch voltage $U_{OC}$ dropped across the disconnect switch is determined and, at 42, current threshold values $U_{UL}$, $U_{LL}$ are determined therefrom. After this, the string is immediately transferred back to the long state at 43 and the method continues at 32. Act 40 can be carried out analogously to act 34, act 41 can be carried out analogously to act 35, act 42 can be carried out analogously to act 36, and act 43 can be carried out analogously to act 30.

FIG. 4 shows a characteristic curve of a photovoltaic field comprising five strings connected in parallel, where each have a circuit according to the disclosure for voltage limitation, and illustrates simultaneously the functioning of the method according to the disclosure. The voltage of the strings connected in parallel is shown on the horizontal axis and the sum of the string currents is shown on the vertical axis. The characteristic curve relates to a string configuration of 32 solar modules in the first section and 4 solar modules in the second section, each with an open-circuit voltage of 46.1 V and a short-circuit current of 8.33 A. An insolation of 1000 W/m² and a cell temperature of 10° C. have been taken as a basis. This produces an MPP power of the string of 9927 W at an MPP voltage of 1296 V.

At a low string voltage as the output voltage, in this case lower than 1300 V, all of the strings of the photovoltaic field are in a long state. As the voltage increases, the characteristic curve shown follows an upper profile 45 up to a voltage $U_{UL,1}$ of 1430 V. At this voltage, the first string is transferred to a short state, as a result of which a negative current step is produced. In the case of a further increasing voltage, a further string is transferred in each case to the short state every 10 V (see current steps at the voltage values $U_{UL,2\ldots5}$) until, at a voltage above 1470 V, all of the strings are in the short state. This ensures that the photovoltaic field does not exceed a voltage of 1475 V even in an open circuit so that an inverter with a maximum permissible input voltage of 1500 V can remain connected to the photovoltaic field safely even in this case although the open-circuit voltage of all of the solar modules of the first and the second section is 1660 V (=36*46.1 V).

If the string voltage decreases starting from the open-circuit voltage at 1475 V, the characteristic curve follows a lower profile 46, in which all of the strings up to a voltage $U_{LL,5}$ of 1340 V are in a short state. At this voltage and every 10 V in the case of a further decreasing voltage (see further voltage step levels $U_{LL,1\ldots4}$), in each case one of the strings is transferred back to a long state so that five positive voltage step levels are produced, until the characteristic curve at a voltage of 1300 V reaches the upper profile 45 again.

The position of the voltage step levels does not have to be designed to be equidistant here, not even fixedly prescribed. In one embodiment, each string ascertains within its circuit for voltage limitation its own threshold values independently of the other strings, for example on the basis of the method described above. However, it is advantageous if the voltage range 48 in which the strings are successively transferred to the short state is separate from the voltage range 47 in which the strings are successively transferred back to the long state. It is further advantageous when all of the first threshold values $U_{UL,1\ldots5}$ are selected to be lower than the maximum permissible input voltage of a connected converter, in particular an inverter. It is likewise advantageous when all of the second threshold values $U_{LL,1\ldots5}$ are selected to be greater than the MPP voltage at the specified conditions so that is it ensured that all of the strings are in a long state when the photovoltaic field is in the MPP. A loss of power is hereby prevented by the method according to the disclosure and by the circuit according to the disclosure for voltage limitation.

The invention claimed is:

1. A circuit for limiting the voltage of a photovoltaic string divided into a first section and a second section of a series circuit of solar modules, comprising:
    a first terminal configured to connect to a first end of the first section, a second terminal configured to connect to a first end of the second section, and a third terminal configured to connect to a second end of the second section,
    a bypass switch connected at one end to the first terminal, and at the other end to the third terminal,
    a disconnect switch connected at one end to the first terminal and at the other end to the second terminal, and
    a controller configured to actuate the bypass switch and the disconnect switch,
    wherein the controller is configured to determine a first threshold value $U_{UL}$ and a second, lower threshold value $U_{LL}$ depending on a switch voltage $U_{OC}$ dropped across the disconnect switch in an open state and taking into account a number of solar modules in the first section and in the second section, and further configured to compare a module voltage $U_S$ dropped between the first terminal and a voltage input of the circuit with the threshold values $U_{UL}$, $U_{LL}$, in order to open the disconnect switch and to close the bypass switch when the first threshold value $U_{UL}$ is exceeded by the module voltage $U_S$, and to open the bypass switch and to close the disconnect switch when the second threshold value $U_{LL}$ is undershot by the voltage $U_S$.

2. The circuit as claimed in claim 1, wherein the circuit is configured to supply energy from the module voltage $U_S$.

3. The circuit as claimed in claim 1, wherein upon a calibration condition being met, the controller, with the disconnect switch closed, calibrates the threshold values $U_{UL}$, $U_{LL}$ by opening the disconnect switch, determining the switch voltage $U_{OC}$ dropped across the opened disconnect switch, and determining updated threshold values $U_{UL}$, $U_{LL}$ under such conditions.

4. The circuit as claimed in claim 3, wherein the condition comprises an expiration of a prescribed period since the last closure of the disconnect switch.

5. The circuit as claimed in claim 3, wherein the condition comprises an exceeding of a prescribed change threshold value by a difference of the module voltage $U_S$ between the present value and the value determined after the last closure of the disconnect switch.

6. A photovoltaic field comprising a plurality of strings connected in parallel between a first and a second DC voltage bus, the strings comprising a first section and a second section of series circuits of solar modules, wherein the sections of each respective string are connected to one another by means of a circuit, the circuit comprising:
a first terminal configured to connect to a first end of the first section, a second terminal configured to connect to a first end of the second section, and a third terminal configured to connect to a second end of the second section,
a bypass switch connected at one end to the first terminal, and at the other end to the third terminal,
a disconnect switch connected at one end to the first terminal and at the other end to the second terminal, and
a controller configured to actuate the bypass switch and the disconnect switch,
wherein the controller is configured to determine a first threshold value $U_{UL}$ and a second, lower threshold value $U_{LL}$ depending on a switch voltage $U_{OC}$ dropped across the disconnect switch in an open state and taking into account a number of solar modules in the first section and in the second section, and further configured to compare a module voltage $U_S$ dropped between the first terminal and a voltage input of the circuit with the threshold values $U_{UL}$, $U_{LL}$, in order to open the disconnect switch and to close the bypass switch when the first threshold value $U_{UL}$ is exceeded by the module voltage $U_S$, and to open the bypass switch and to close the disconnect switch when the second threshold value $U_{LL}$ is undershot by the voltage $U_S$,
wherein in each case one end of the first section is connected to the first DC voltage bus and the other end of the first section is connected to the first terminal of the circuit, wherein one end of the second section is connected to the second terminal and the other end of the second section is connected to the second DC voltage bus and the third terminal of the circuit, and wherein the voltage input is connected to a terminal of a solar module of the first section being opposite to the first terminal of the circuit.

7. The photovoltaic field as claimed in claim 6, wherein the voltage input is connected to the terminal of a solar module of the first section that is connected directly to the first terminal of the circuit using the other terminal.

8. The photovoltaic field as claimed in claim 6, wherein a number of solar modules of the first section is selected such that, in the case of a lowest specified ambient temperature and a highest specified insolation, an open-circuit voltage of the solar modules still remains below a prescribed maximum value, and a number of solar modules of the second section is selected such that, in the case of the lowest specified ambient temperature, an MPP voltage of the series circuit of the first and second section still remains below the prescribed maximum value.

9. The photovoltaic field as claimed in claim 8, wherein the prescribed maximum value is greater than 1000 volts.

10. The photovoltaic field as claimed in claim 6, wherein the other end of the second section is connected to the second DC voltage bus by means of a third section of solar modules.

11. The photovoltaic field as claimed in claim 6, wherein in each circuit of the parallel strings an offset that is different from one another is stored therein, which offset causes the respective controllers of the circuits to determine different threshold values $U_{LL}$, $U_{LL}$ in the case of an identical determined switch voltage $U_{OC}$.

12. A method for limiting the voltage of a photovoltaic string, wherein the string comprises a first section of solar modules and a second section of solar modules, wherein a bypass switch is arranged in parallel with the second section and a disconnect switch is arranged in series with the solar modules of the second section, comprising:
determining a module voltage $U_S$ within the first section and a switch voltage $U_{OC}$ dropped across the disconnect switch while the disconnect switch is open and the bypass switch is closed,
determining a first threshold value $U_{UL}$ and a second, lower threshold value $U_{LL}$ depending on the switch voltage $U_{OC}$ and taking into account a number of solar modules in the first section and a number of solar modules in the second section, and
closing the bypass switch and opening the disconnect switch to establish a short string state when the presently determined module voltage $U_S$ exceeds the first threshold value $U_{UL}$, and opening the bypass switch and closing the disconnect switch to establish a long string state when the presently determined module voltage $U_S$ undershoots the second threshold value $U_{LL}$.

13. The method as claimed in claim 12, wherein determining the module voltage $U_S$ and the switch voltage $U_{OC}$ are repeated, and the first threshold value $U_{UL}$ and the second, lower threshold value $U_{LL}$ are determined anew with every repetition.

14. The method as claimed in claim 12, wherein a condition for recalibration is checked during the long string state, and wherein, upon a meeting of the condition, the switch position of the bypass switch and the disconnect switch change briefly to the short string state in order to determine the switch voltage $U_{OC}$ dropped across the disconnect switch and to determine updated threshold values $U_{UL}$, $U_{LL}$ therefrom.

15. The method as claimed in claim 14, wherein the condition comprises the expiration of a waiting time, in which the string was in a long string state, wherein the waiting time is greater than 100 seconds.

16. The method as claimed in claim 14, wherein the condition comprises an exceeding of a prescribed change threshold value by the difference of the module voltage $U_S$ between the current value and the value directly after the last change to the long string state.

17. The method as claimed in claim 12, wherein, after the change to the short string state, the string remains in this state for a minimum time period, wherein the minimum time period is greater than 2 ms.

18. The method as claimed in claim 12, wherein the second threshold value $U_{LL}$ is determined from the first threshold value $U_{UL}$ using a value table.

19. The method as claimed in claim 12, wherein permissible value ranges for the first threshold value $U_{UL}$ and the second threshold value $U_{LL}$ are prescribed, wherein, in the case of deviation from the respective permissible value range, the threshold value is set to the respective limit value of the value range.

\* \* \* \* \*